United States Patent [19]
Ko

[11] Patent Number: 5,309,464
[45] Date of Patent: May 3, 1994

[54] SEMICONDUCTOR LASER AND METHOD FOR MANUFACTURING THE SAME

[75] Inventor: Hyun C. Ko, Seoul, Rep. of Korea

[73] Assignee: Gold Star Co., Ltd., Seoul, Rep. of Korea

[21] Appl. No.: 956,419

[22] Filed: Oct. 5, 1992

[30] Foreign Application Priority Data

Oct. 5, 1991 [KR] Rep. of Korea ............... 17459/1991

[51] Int. Cl.$^5$ ............................................. H01S 3/18
[52] U.S. Cl. .......................................... 372/43; 372/50
[58] Field of Search ....................... 372/43, 44, 45, 46, 372/50

[56] References Cited

U.S. PATENT DOCUMENTS 5,007,063 4/1991 Kahen .................................... 372/45
5,146,465 9/1992 Khan et al. ............................ 372/43

OTHER PUBLICATIONS

Physics of Semiconductor Lasers, Mroziewicz et al., PWN—Polish Scientific Publishers, pp. 198-237.

Primary Examiner—Rodney B. Bovernick
Assistant Examiner—Robert E. Wise
Attorney, Agent, or Firm—Finnegan, Henderson, Farabow, Garrett & Dunner

[57] ABSTRACT

A semiconductor laser including a semiconductor substrate, a back reflection layer formed over the semiconductor substrate, a first clad layer formed over the back reflection layer, an active layer formed over the first clad layer, the active layer having a width smaller than that of the first clad layer, and a second clad layer formed over the active layer. The second clad layer has a flat upper surface and a width identical to that of the first clad layer. A front reflection layer is formed over the second clad layer. The semiconductor laser also includes impurity diffusion regions of a first conductivity type and a second conductivity type. The impurity diffusion regions extend from the upper surface of the second clad layer to predetermined depth portions of the first clad layer and are in contact with opposite side portions of the active region, respectively. First and second electrodes adapted to oscillate laser beams are formed over the first and second conductivity type impurity diffusion regions. A third electrode adapted to discharge laser beams and a fourth electrode adapted to discharge laser beams are formed over the front reflection layer and beneath the bottom surface of the semiconductor substrate, respectively.

30 Claims, 9 Drawing Sheets

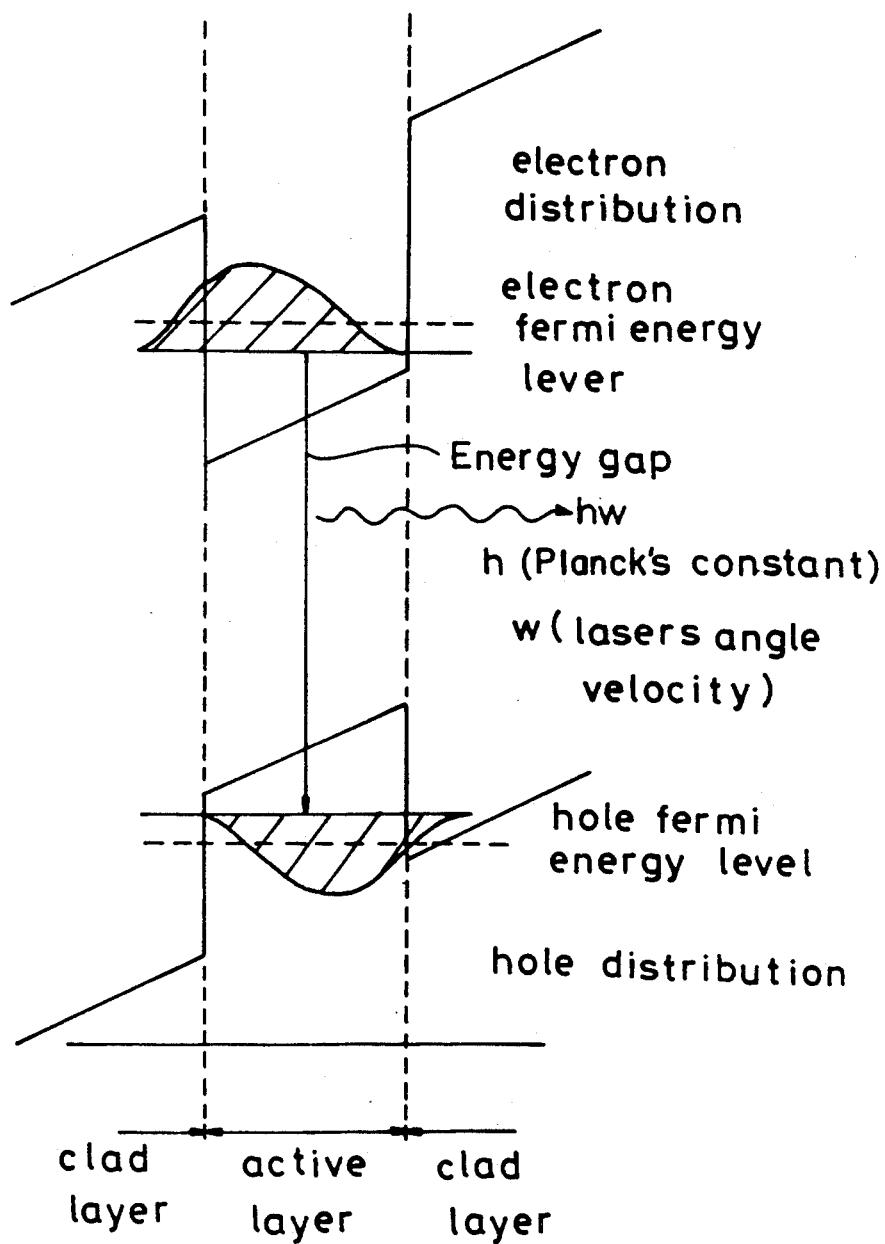

SEMICONDUCTOR LASER AND METHOD FOR MANUFACTURING THE SAME

BACKGROUND OF THE INVENTION

1. Field of the Invention

The present invention relates to a semiconductor laser and a method for manufacturing the same.

2. Description of the Prior Art

Semiconductor lasers have been highlighted as a light emitting source for optical fiber communication and optical information processing since continuous oscillation at room temperature of GaAlAs based semiconductor lasers was reported in 1970. It is not too much to say that such semiconductor lasers have been developed according to technical requirements in optical fiber communication.

Following the development of GaAlAs based semiconductor layers oscillating at a wavelength range of 0.7 μm to 0.9 μm, the development of InGaAsP based semiconductor lasers oscillating at a long wavelength range has been also promoted according to an increase in the minimum loss wavelength of optical fibers, for example, by 1.1 μm to 1.6 μm.

In addition to such semiconductor lasers for communication, on the other hand, another type of semiconductor lasers have been manufactured in mass, which oscillate at 0.7 μm, for processing optical information of laser printers, compact discs and video optical discs. Applications of various industrial semiconductor lasers have also extended rapidly.

Semiconductor lasers have a higher efficiency over other types of lasers and achieve modulation at high speed. They are also advantageous by virtue of their very miniature constructions.

The semiconductor lasers can have a wavelength of emitted light selected variously within a wide wavelength range from the wavelength of visible light to the wavelength of far infrared ray. Their life is also assured up to several decades.

Recently, the disadvantage of the semiconductor lasers having poor interference over other types of lasers has been compensated and the optical output of semiconductor lasers is also on an increasing trend. In this regard, the semiconductor lasers are expected to be substituted for gas lasers and solid state lasers in a field involving no requirement of high energy.

Now, the operational principle of the above-mentioned semiconductor lasers will be described and the construction of a conventional semiconductor laser will be also described.

Semiconductor lasers are made of a compound semiconductor such as GaAs or InP which has a direct transition type energy band structure. As voltage is forwardly applied to a P-N junction of such a semiconductor, current flows through the semiconductor. This current flow causes electrons in the N-region and holes in the P-region to flow toward the opposite regions and to be recoupled together and thus emit light.

At a small quantity of current flow, the recoupling of electrons and holes are achieved irregularly. As a result, any induced emission of light required for operating the semiconductor laser is not achieved since occurring optical waves have no correlation with one another. At a large quantity of current flow, an inverted electron distribution is formed near the P-N junction, as shown in FIG. 1. The inverted electron distribution means that more electrons at a lower energy level are distributed, over a higher energy level. At such an inverted electron distribution, light is inducibly emitted by virtue of the electron-hole recoupling. In this case, the region at which the inducible emission of light caused by the inverted electron distribution is called an active region or a gain region.

As a gain larger than a loss of a resonator is generated upon an increase of current applied, the laser is oscillated. The current providing the gain required for oscillating the laser is called a threshold current which is the important dimension for determining the performance of the usable condition of semiconductor laser.

In a semiconductor laser, the resonator for obtaining the oscillation of optical waves uses mainly the crystal sectional surfaces (namely, the surfaces of cleavage) of the semiconductor itself.

A discussion will be now made for an efficient structure capable of reducing the threshold current in the semiconductor laser. If the recoupling of carriers (namely, electrons and holes) is achieved at a region involving no inverted electron distribution, that is, outwardly of a gain region, the light emitted due to the recoupling can not contribute to the inducible emission.

In such a double hetero (DH) structure, an active layer (GaAs) having a small energy gap is interposed between clad layers (GaAlAs) having a large energy gap. A semiconductor laser having such a DH structure is a simple diode in which its one hetero-junction is a P-N junction. As current flows forwardly through the diode, the holes in the N-type clad layer flow into and are then implanted in the active region.

Since the active layer has a small band gap as shown in FIG. 2, the clad layers disposed at opposite surfaces of the active layer form energy barriers which function to restrain implanted carriers in the active region. Accordingly, the density of carriers in the thin active region is very high and the recoupling of carriers for emitting light is mainly achieved in the active layer.

The refractive index of GaAs constituting the active layer is higher than that of GaAlAs constituting the clad layers. Light has a property of concentrating on the region having a large refractive index. In the DH structure, accordingly, light is focused on the active layer, so that densities of carriers and optical waves in the active layer are very high, thereby enabling the threshold current to be reduced.

Furthermore, the threshold current can be further lowered by restraining the carriers and the optical waves in a direction perpendicular to the active layer in the narrow active region. To this end, a metal electrode having a narrow strip shape is formed as shown in FIG. 2, to control the flow of current spatially. As shown in FIG. 2, opposite side surfaces of the metal electrode are formed roughly, so as to prevent the light concentration. Such a structure is called a strip type hetero structure. It is often called a gain transmission type structure since light is guided to a gain region in which the density of carriers is high.

In addition, there is a method for restraining optical waves in a direction parallel to the active layer. In this connection, FIG. 3 shows a buried type hetero structure which is commonly used in communication lasers. As shown in FIG. 3, the structure has a shape that a GaAs active layer is surrounded at its opposite sides by N-type GaAlAs layers.

As above-mentioned, the GaAs layer forms a waveguide path since it is surrounded at its upper, lower, left and right portions by the GaAlAs layers having a refractive index lower than that of the GaAs layer.

As shown in FIG. 3, opposite side surfaces of the waveguide are formed roughly, so as to prevent the light concentration. This type of waveguide is called the refractive index waveguide type.

Such a DH structure has an advantage of a low threshold current. Also, it has a stable oscillation transverse mode characteristic and is advantageous for communication and a information processing.

For using semiconductor lasers in signal processing, a switch characteristic for intermittently controlling the emission of laser is generally required.

In continuous oscillation type conventional semiconductor lasers shown in FIGS. 2 and 3, the supplying of current a to semiconductor laser is switched for switching the laser beam emission. Such a method is difficult to process signals having a frequency of several MHZ or greater, due to the limitation of a drive circuit of the semiconductor laser.

In this connection, a semiconductor layer having a structure shown in FIG. 4 has been proposed by Y. Kan et al in 1986 (IEEE J. QUANTUM ELECTRON, QE-22, 1837, 1986). In such a semiconductor, an electric field is applied to an active layer which is, in turn, excited by external light, for example, He—Ne laser beams, thereby causing the laser to be oscillated.

At this time, the oscillated laser is sensitively affected by the applied electric field and thereby does not oscillate at a bias voltage V1 of $-5$ V. Accordingly, when charges are filled in a hetero junction, upon applying current to the semiconductor laser, the frequencies of processible signals oscillated are limited to several MHZ, as shown in FIGS. 2 and 3. However, when the oscillation of laser is controlled by the electric field, it is possible to process signals having a frequency of up to several Tera HRZ.

The structure and operation of the semiconductor laser proposed by Y. Kan et al will now be described in conjunction with FIGS. 4 to 6.

FIG. 4 is a sectional view of the structure of a semiconductor laser. As shown in FIG. 4, the semiconductor laser comprises a semitransparent electrodes 1 as an uppermost layer and an Au/Cr electrode 2 as a lowermost layer. These layers serve to cause a current flow into the semiconductor laser. The semiconductor laser has at its middle portion a GaAs active layer 3 having a thickness of 120 Å. Over upper and lower surfaces of the active layer, a pair of GaAlAs clad layers 4 and 5 having a thickness of 0.3 $\mu$m are formed, respectively. Between the semitransparent electrode 1 and the GaAlAs clad layer 4, a N-GaAlAs layer 6 is formed which has an impurity concentration of $3 \times 10^{17}$ cm$^{-3}$ and a thickness of 1.5 $\mu$m. On the other hand, a P-GaAlAs layer 7 having an impurity concentration of $3 \times 10^8$ cm$^{-3}$ and a thickness of 2 $\mu$m is formed between the Au/Cr electrode 2 and the GaAlAs layer 5. Finally, a GaAs substrate 8 is formed at a predetermined portion between the semitransparent electrode 1 and the N-GaAlAs layer 6.

FIG. 6 shows an energy band structure corresponding to the structure of FIG. 4. As an electric field is applied to the semiconductor laser, electrons presented in a conduction band and holes presented in a valence band move opposite directions with respect to the electric field, thereby causing the recoupling rate therebetween to be reduced. As a result, the oscillation is stopped and the laser emission is cut off. That is, the oscillation is stopped when the bias voltage V1 is $-5$ V, as shown in FIG. 5.

When the electric field, namely, the bias voltage V1 disappears, the electrons and holes return to their original positions. Accordingly, the oscillation occurs again and thus laser beams are emitted.

As apparent from the above description, Kan's technique makes it possible to switch rapidly the emission of laser beams from the semiconductor laser by oscillating the laser at its active layer using He—Ne laser beams and applying an electric field in a direction perpendicular to the active layer or removing the electric field.

In all of the above-mentioned conventional semiconductor lasers, however, the oscillation is achieved by crystal sectional surfaces (namely, the surfaces of cleavage) formed perpendicular to the active layer and the emission of laser beams is achieved in a direction parallel to the surface of cleavage. As a result, the conventional semiconductor lasers can be suitably used only for the manufacture of unit semiconductor lasers. They are unsuitable for the manufacture of semiconductor lasers of an integrated type in which unit semiconductor lasers are arranged in two dimensions. In these semiconductor lasers, consequently, it is impossible to process simultaneously a plurality of signals such as video signals.

SUMMARY OF THE INVENTION

Therefore, an object of the invention is to eliminate the above-mentioned disadvantages encountered in the prior arts and to provide a semiconductor laser capable of having an integrated structure and processing simultaneously a plurality of signals.

In accordance with the present invention, this object can be accomplished by providing a semiconductor laser comprising: a semiconductor substrate; a back reflection layer formed over the semiconductor substrate; a first clad layer formed over the back reflection layer; an active layer formed over the first clad layer, the active layer having a width smaller than that of the first clad layer; a second clad layer formed over the active layer, the second clad layer having a flat upper surface and a width identical to that of the first clad layer; a front reflection layer formed over the second clad layer; an impurity diffusion region of a first conductivity type extending from the upper surface of the second clad layer to a predetermined depth portion of the first clad layer, the impurity diffusion region being in contact with one of opposite side portions of the active region; an impurity diffusion region of a second conductivity type extending from the upper surface of the second clad layer to a predetermined depth portion of the first clad layer, the impurity diffusion region being in contact with the other of opposite side portions of the active region; a first electrode adapted to oscillate laser beams and formed over the upper surface of the first conductivity type impurity diffusion region; a second electrode adapted to oscillate laser beams and formed over the upper surface of the second conductivity type impurity diffusion region; a third electrode adapted to discharge laser beams and formed over the front reflection layer; and a fourth electrode adapted to discharge laser beams and formed beneath the bottom surface of the semiconductor substrate.

BRIEF DESCRIPTION OF THE DRAWINGS

Other objects and aspects of the invention will become apparent from the following description of embodiments with reference to the accompanying drawings in which:

FIG. 6 is a schematic view for explaining a variation in energy band in the semiconductor laser of FIG. 4;

DETAILED DESCRIPTION OF THE PREFERRED EMBODIMENTS

Referring to FIGS. 7a to 7i, a method of a semiconductor laser is illustrated in accordance with the present invention.

Figure 1:
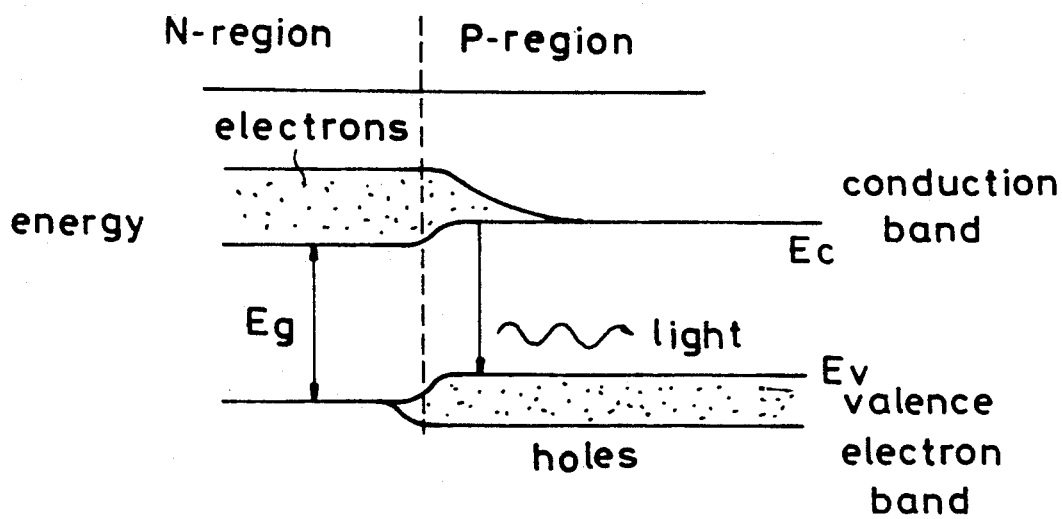
FIG. 1 is a schematic view for explaining the principle of a semiconductor laser.
Figure 2:
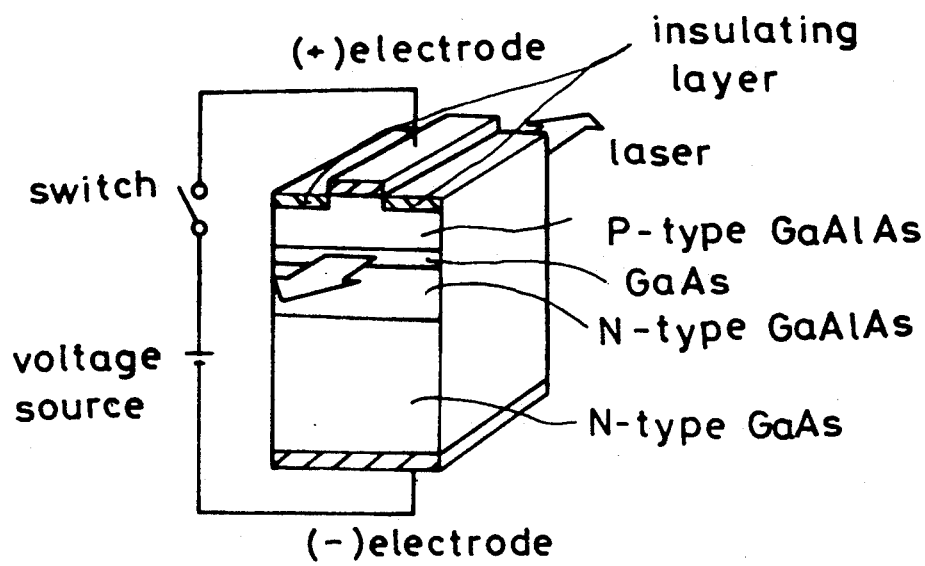
FIG. 2 is a perspective view of a semiconductor laser having a conventional DH structure.
Figure 3:
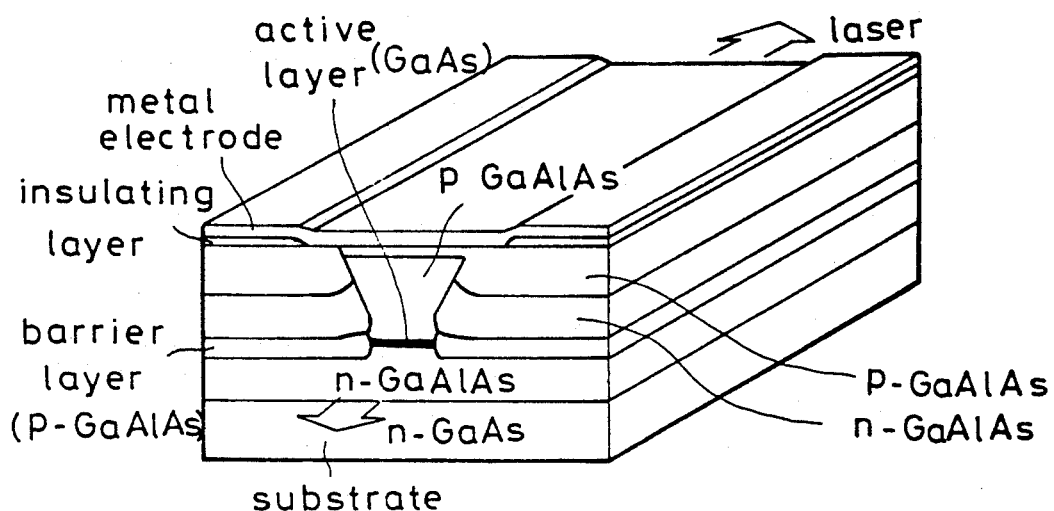
FIG. 3 is a perspective view of a semiconductor laser having a conventional buried type DH structure.
Figure 4:
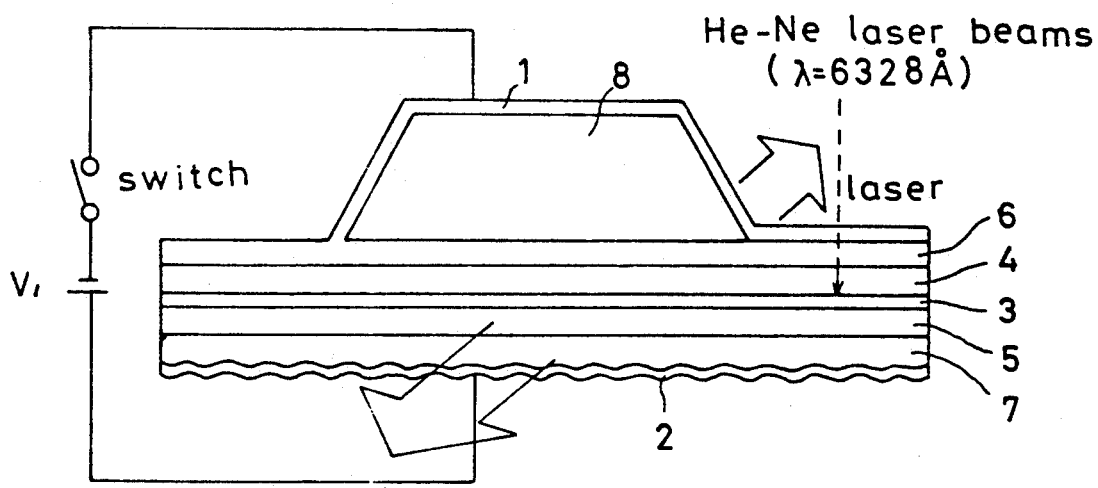
FIG. 4 is a sectional view of a conventional semiconductor laser in which laser beams are emitted by external light.
Figure 5:
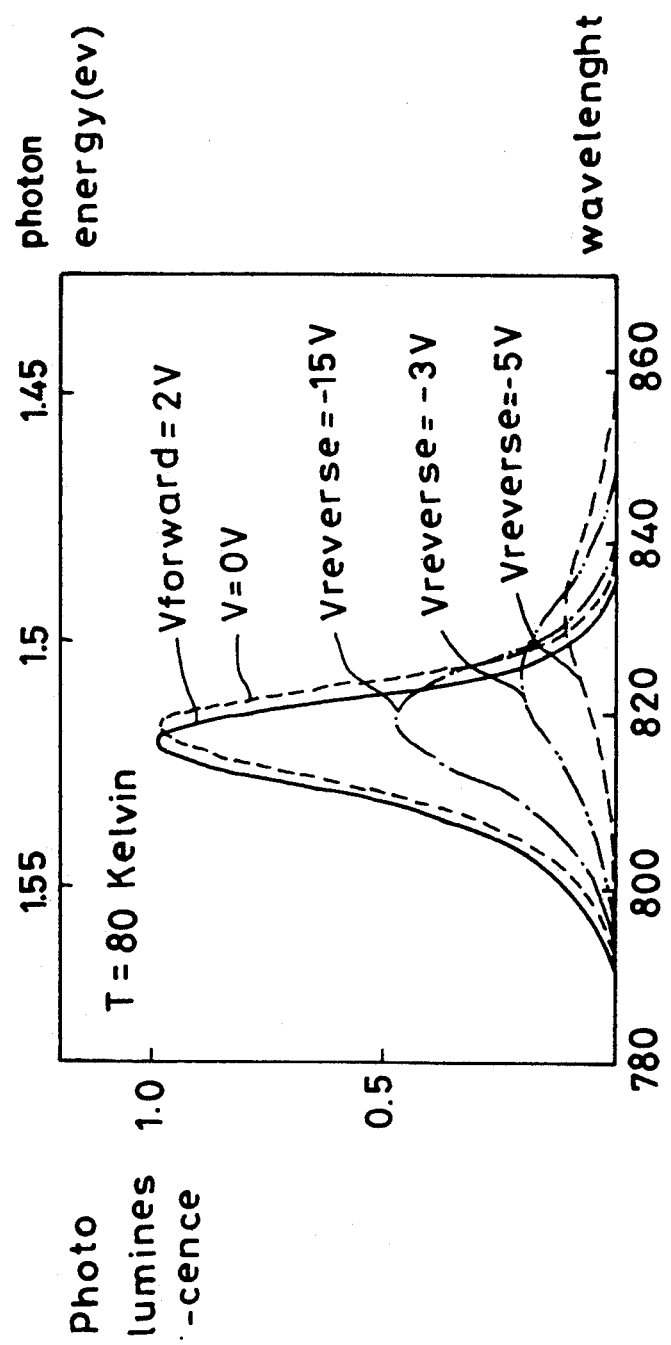
FIG. 5 is a graph showing an oscillation characteristic of laser beams based on the intensity of an electric field applied to the semiconductor laser of FIG. 4.
Figure 7A:
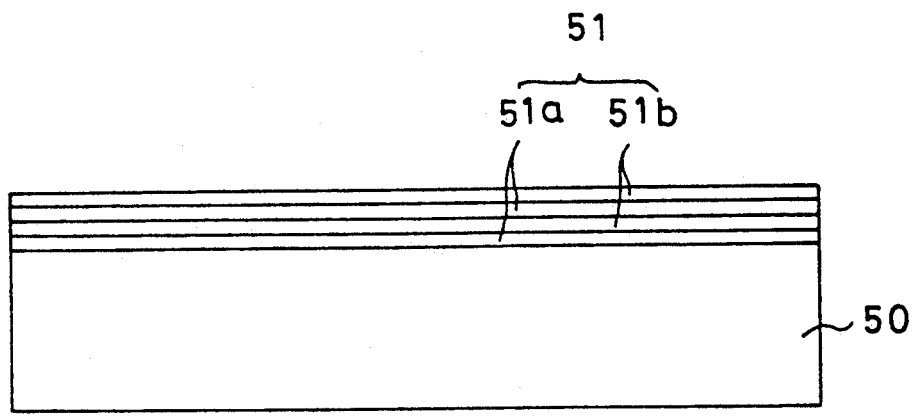
FIGS. 7a to 7i are sectional views illustrating a method for manufacturing a semiconductor laser in accordance with the present invention.

In accordance with the method, first, over a GaAs substrate (or an InP substrate) 50 a back reflection layer 51 is formed using a chemical vapor deposition (CVD) method or an epitaxial growth method, as shown in FIG. 7a. The back reflection layer 51 comprises alternately deposited AlAs laminate layers 51a and GaAs laminate layers 51b. In place of these AlAs laminate layers 51a and GaAs laminate layers 51b, the back reflection layer 51 may include four InP layers.

In the illustrated case, the back reflection layer 51 includes two AlAs laminate layers 51a and two GaAs laminate layers 51b. The number of laminate layers may be increased or decreased.

Figure 7B:
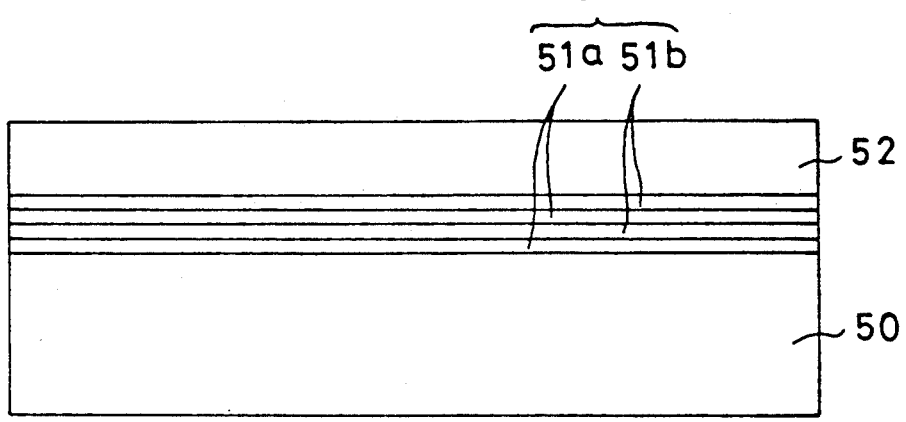

Thereafter, a first $Ga_xAl_{1-x}As$ layer 52 as a first clad layer is deposited over the back reflection layer 51 using the epitaxial growth method or the CVD method, under the condition of using the uppermost GaAs laminate layer 51b of back reflection layer 51 as a seed, as shown in FIG. 7b. As the epitaxial growth method and the CVD method, one selected from a liquid phase epitaxy (LPE) method, a metal organic chemical vapor deposition (MOCVD) method and a molecular beam epitaxy (MBE) method is used.

Figure 7C:
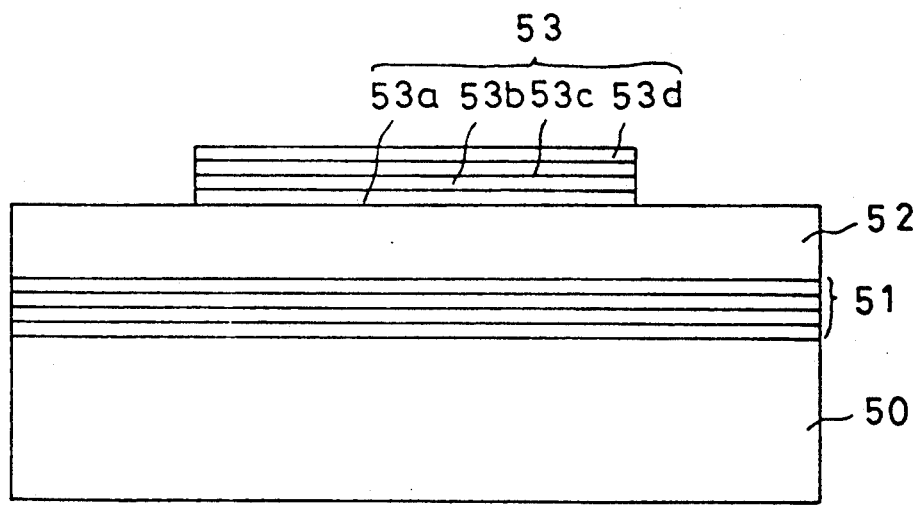

As shown in FIG. 7c, an active layer 53 is then formed over the first $Ga_xAl_{1-x}As$ layer 52, using the CVD method or the epitaxial growth method. The active layer 53 has a width smaller than that of the first $Ga_xAl_{1-x}As$ layer 52. The active layer 53 is of a multilayered laminate structure comprising four GaAs laminate layers 53a to 53d or alternately deposited GaAs laminate layers and GaAlAs laminate layers. The material of the active layer 53 may include GaAs or InGaAsP. That is, all direct transition type semiconductor may be used as the material of active layer 53.

Figure 7D:
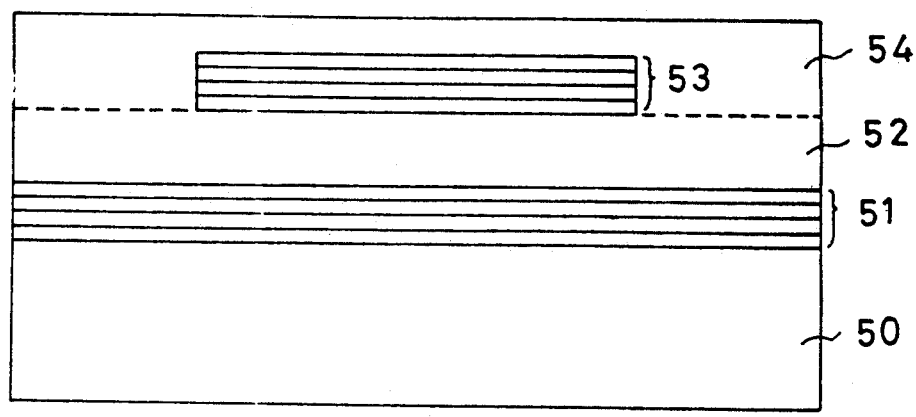

Subsequently, a second $Ga_xAl_{1-x}As$ layer 54 as a second clad layer is deposited over the first $Ga_xAl_{1-x}As$ layer 52 using the epitaxial growth method or the CVD method, under the condition of using the first $Ga_xAl_{1-x}As$ layer 52 as a seed, as shown in FIG. 7d. The second $Ga_xAl_{1-x}As$ layer 52 covers totally the exposed surface of active layer 53 and has a flat upper surface.

In place of the first and second $Ga_xAl_{1-x}As$ layers 52 and 54, a first and second InP layers may be formed, using the epitaxial growth method.

The epitaxial growth method and the CVD method used for the second $Ga_xAl_{1-x}As$ layer 54 are the same as those used for the first $Ga_xAl_{1-x}As$ layer.

Figure 7E:
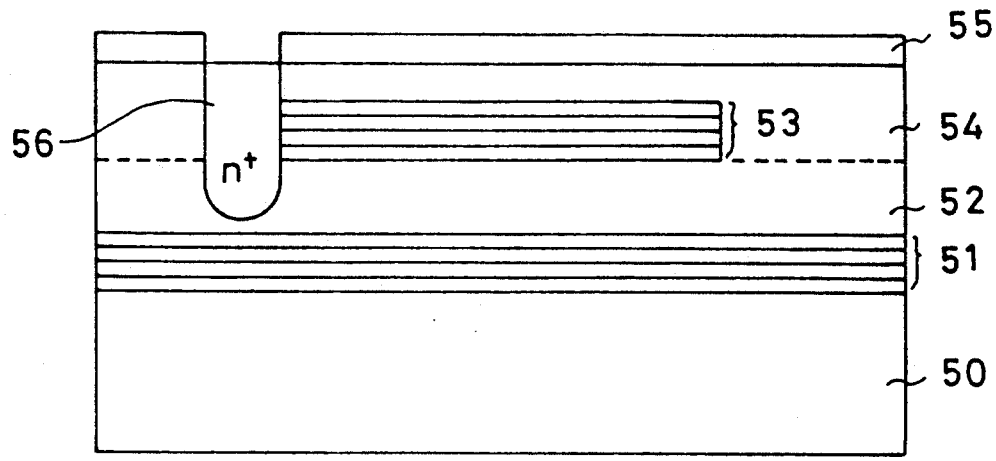

Over the second $Ga_xAl_{1-x}As$ layer 54, a first photoresist pattern 55 is formed. Using the first photoresist pattern 55 as an ion implantation mask, impurity ions of a high concentration N (N+) type are implanted on the surface of the second $Ga_xAl_{1-x}As$ layer 54 and diffused, so as to form a N+ type impurity diffusion region 56 at one side (the left, in the illustrated case) of the active region 53, as shown in FIG. 7e. The N+ type impurity diffusion region 56 has a predetermined width and extends from the surface of the second $Ga_xAl_{1-x}As$ layer 54 by a predetermined depth.

The first photoresist pattern 55 covers the second $Ga_xAl_{1-x}As$ layer 54 except for its predetermined portion disposed at the left of the active layer 53. In this case, the N+ type impurity diffusion region 56 is in contact with the left end of the active layer 53, so as to serve as a current implantation layer.

Figure 7F:
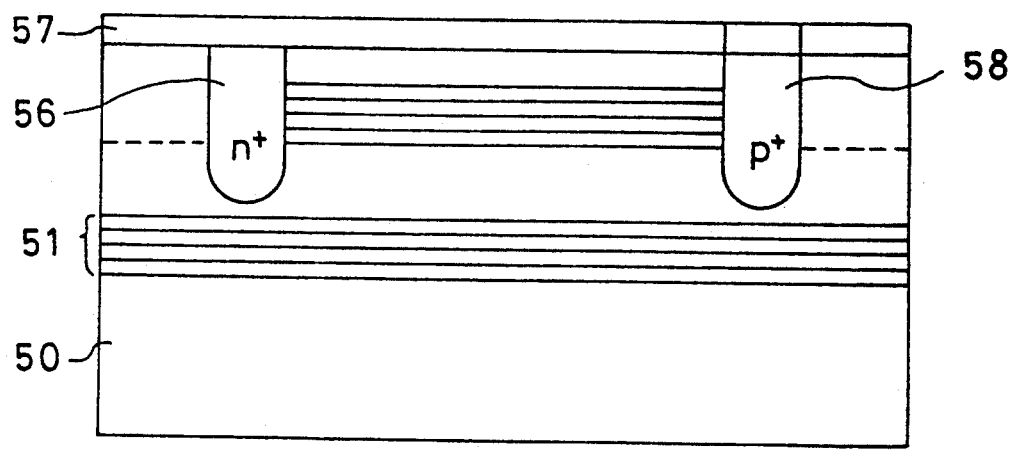

After removing the first photoresist pattern 55, a second photoresist pattern 57 is formed over the second $Ga_xAl_{1-x}As$ layer 54. Using the second photoresist pattern 57 as an ion implantation mask, impurity ions of a high concentration P (P+) type are implanted in the surface of the second $Ga_xAl_{1-x}As$ layer 54 and diffused, so as to form a P+ type impurity diffusion region 58 at the other side (the right) of the active region 53, as shown in FIG. 7f. Similar to the N+ type impurity diffusion region 56, the P+ type impurity diffusion region 58 has a predetermined width and extends from the surface of the second $Ga_xAl_{1-x}As$ layer 54 by a predetermined depth.

The second photoresist pattern 57 covers the second $Ga_xAl_{1-x}As$ layer 54 except for its predetermined portion disposed at the right of the active layer 53. In this case, the P+ type impurity diffusion region 58 serves as a forward current implantation layer having a predetermined size for the laser oscillation, together with the N+ type impurity diffusion region 56.

Figure 7G:
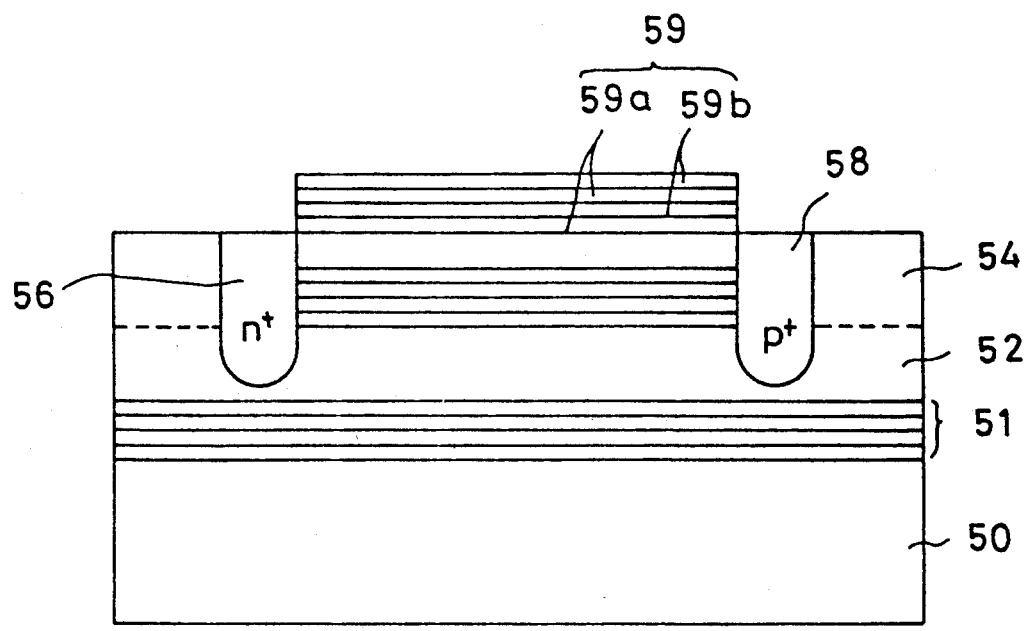

A front reflection layer 59 is then formed over the surface of the second $Ga_xAl_{1-x}As$ layer 54 at a region defined between the N+ type impurity diffusion region 56 and the P+ type impurity diffusion region 58, that is, over a portion of the second $Ga_xAl_{1-x}As$ layer 54 disposed over the active layer 53, by using the CVD method and the epitaxial growth method, as shown in FIG. 7g. Accordingly, the front reflection layer 59 has the same width as that of the active layer 53.

The front reflection layer 59 is formed by depositing or epitaxial-growing alternately Si laminate layers 59a and $Al_2O_3$ laminate layers 59b according to the CVD method or the epitaxial growth method. In the illustrated case, the front reflection layer 59 comprises two Si laminate layers 59a and two $Al_2O_3$ laminate layers 59b. The number of laminate layers may be increased or decreased.

Figure 7H:
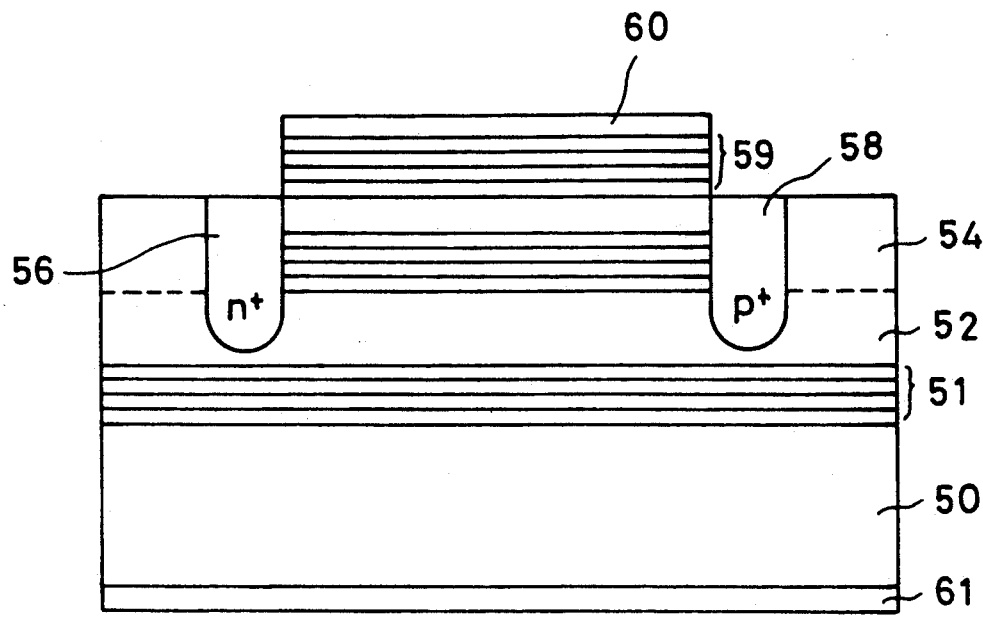

For supplying current between the front reflection layer 59 and the GaAs substrate 50, a first electrode 60 and a second electrode 61 are then deposited over the upper surface of front reflection layer 59 and the bottom surface of GaAs substrate 50 by using the CVD method, respectively, as shown in FIG. 7h.

The material of the first and second electrodes 60 and 61 may include a transparent material such as indium tin oxide (ITO), so as to emit laser beams.

Figure 7I:
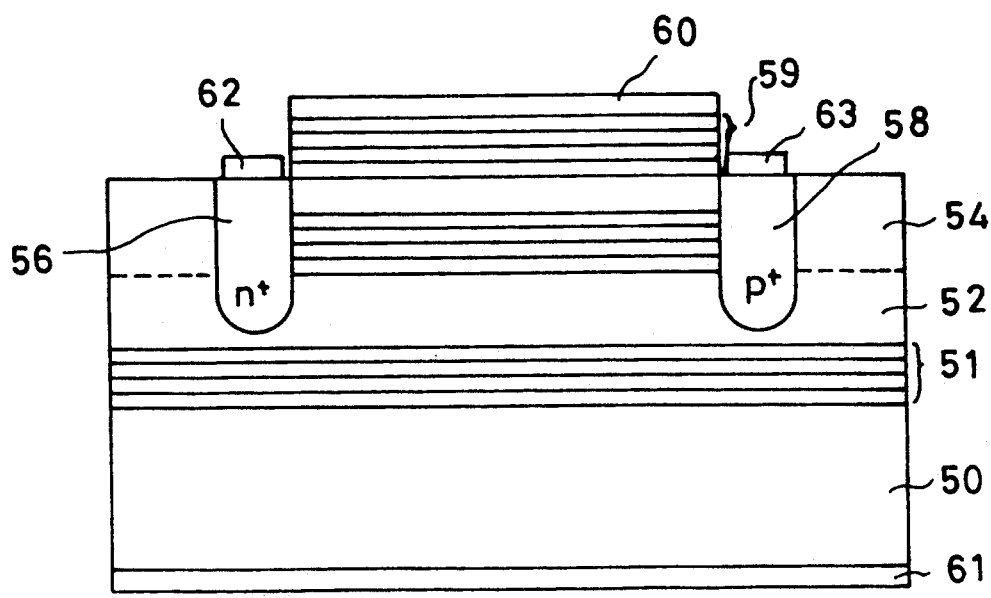

As shown in FIG. 7i, a third electrode 62 and a fourth electrode 63 are then deposited over the N+ type impurity diffusion region 56 and the P+ type impurity diffusion region 58 by using the CVD method, respectively, so as to supply a predetermined magnitude of current between the N+ type impurity diffusion region 56 and the P+ type impurity diffusion region 58. Respective widths of the third and fourth electrodes 62 and 63 are smaller than those of the N+ type impurity diffusion region 56 and the P+ type impurity diffusion region 58 so that they do not come into contact with the front reflection layer 59.

The material of the third and fourth electrodes 62 and 63 may include a polysilicon doped with impurity ions of a predetermined conductivity type (N type or P type) or a metal.

Although the front and back surfaces of the obtained semiconductor laser are not shown in FIG. 7i, they are formed differently from each other or roughly, so as to prevent forward and backward reflections of laser beams.

Generally, semiconductor lasers also function as optical resonators for increasing efficiently laser beams. Accordingly, germanium or silicon are hardly used as the material of semiconductor laser diodes. The material of semiconductor laser diodes include III-V group intermetallic compounds such as GaAs or $Ga_xAl_{1-x}P_x$ and mixtures thereof. For example, GaAs has a strong cleavage along <110> surface. A surface obtained by such a cleavage forms a reflection surface being very flat and exhibiting a high parallelism. Accordingly, GaAs makes it possible to provide optical resonators by virtue of the cleavage.

Otherwise, if surfaces, facing in directions such that laser beams are not reflected, are formed differently from each other or roughly, no reflection of laser beams in the directions is achieved, thereby preventing an increase of laser beams. As a result, laser beams are emitted only toward the surface of cleavage.

Figure 8:
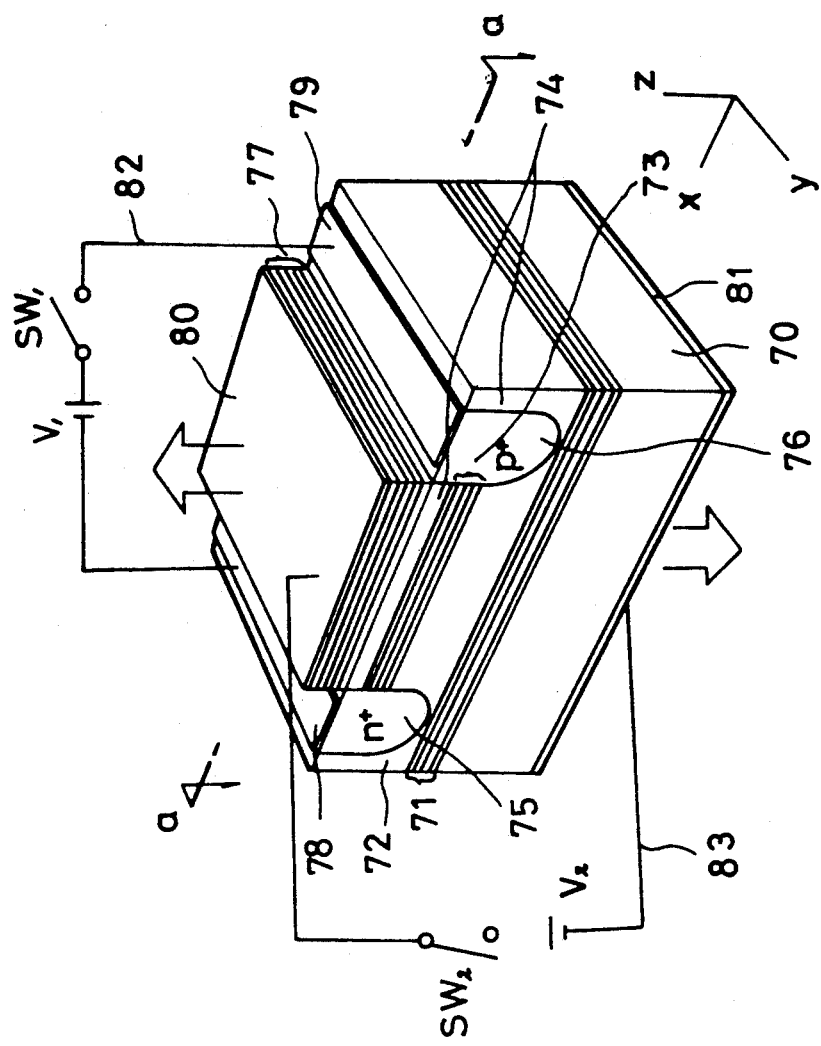
FIG. 8 is a perspective view of the semiconductor laser according to the present invention.

FIG. 8 is a perspective view of a semiconductor laser obtained according to the processes shown in FIGS. 7a to 7i. The sectional views of FIGS. 7a to 7i are taken along the line a—a' of FIG. 8.

As shown in FIG. 8, over a compound semiconductor substrate (for example, GaAs substrate) 70, a back reflection layer 71 is formed having a multi-layered laminate structure including, for example, GaAs laminate layers and AlAs laminate layers. A first clad layer 72 such as a $Ga_xAl_{1-x}As$ layer is formed over the back reflection layer 71.

In place of the GaAs laminate layers and AlAs laminate layers, the back reflection layer 71 may comprise a plurality of laminate layers having different refractive indexes.

Over the first clad layer 72 is formed an active layer 73 having a multi-layered laminate structure. The active layer 73 has a width smaller than that of the first clad layer 72 and a predetermined thickness. Over the active layer 73, a second clad layer 74 such as a $Ga_xAl_{1-x}As$ layer is formed which has a flat upper surface. At the left of the active layer 73, an impurity diffusion region 75 of the first conductivity type (for example, N type) is formed which extends from the upper surface of the second clad layer 74 by a predetermined depth. The impurity diffusion region 75 is in contact with the left side surface of the active layer 73.

The material of active layer 73 may include a direct transition type compound semiconductor.

At the right of the active layer 73, a second clad layer 74 such as a $Ga_xAl_{1-x}As$ layer is formed which has a flat upper surface. At the right of the active layer 73, an impurity diffusion region 76 of the second conductivity type (for example, P+ type) is formed which extends from the upper surface of the second clad layer 74 by a predetermined depth. The impurity diffusion region 76 is in contact with the right side surface of the active layer 73.

A front reflection layer 77 with a multi-layered structure including, for example, Si laminate layers and $Al_2O_3$ laminate layers is formed over a portion of the upper surface of second clad layer 74 disposed over the active layer 73.

In place of Si laminate layers and $Al_2O_3$ laminate layers, the front reflection layer 77 may comprise a plurality of laminate layers having different refractive indexes.

Over the first conductivity type impurity diffusion region 75, a first electrode 78 is formed which has a width smaller than that of the first conductivity type impurity diffusion region 75. Similarly, over the second conductivity type impurity diffusion region 76, a second electrode 79 is formed which has a width smaller than that of the second conductivity type impurity diffusion region 76.

The reason why respective widths of the first and second conductivity type impurity diffusion regions 75 and 76 are smaller than those of the first and second electrodes 78 and 79 is to prevent the first and second conductivity type impurity diffusion regions 75 and 76 from coming into contact with the front reflection layer 77.

A third electrode 80 and a fourth electrode 81 are disposed at the upper surface of front reflection layer 77 and the bottom surface of compound semiconductor substrate 70, respectively. The material of the third and fourth electrodes 80 and 81 should be transparent. For example, the material may include ITO.

Between the first and second electrodes 78 and 79, a first voltage source V1 and a first switch SW1 are connected in series via a first wire 82, so as to supply forward current for the laser oscillation. Between the third and fourth electrodes 80 and 81, a second voltage source V2 and a second switch SW2 are connected in series via a second wire 83, so as to supply forward current for the laser emission switching.

Although the front and back surfaces of the obtained semiconductor laser are not shown in FIG. 8, they are formed differently from each other or roughly, so as to prevent the reflection of laser beams therebetween.

Now, the operation of the semiconductor laser having the structure shown in FIG. 8 will be described.

As a bias voltage of a predetermined level is supplied to the semiconductor laser via the first and second electrodes 78 and 79 at an ON state of the first switch SW1, forward current is supplied to the semiconductor laser, so that electrons and holes are generated in the first and second conductivity type impurity diffusion regions 75 and 76, respectively. These electrons and holes are recoupled in the active layer 73, thereby generating laser beams.

The generated laser beams are reflected on the front and back reflection layers 77 and 71 having different refractive indexes. That is, the laser beams are oscillated between the front and back reflection layers 77 and 71 and thereby multiplied. The multiplied laser beams are then discharged out of the semiconductor laser, via the front reflection layer 77, the back reflection layer 71 and the third and fourth electrodes 80 and 81 made of a transparent material.

At this time, the second switch SW2 is switched to its ON state, so that a bias voltage of a predetermined level is applied to the semiconductor laser via the third and fourth electrodes 80 and 81, thereby generating an electric field in the active layer 73. As a result, the laser beams generated in the active layer 73 are not oscillated and thus not discharged out of the semiconductor laser.

Briefly, the first switch SW1, the first electrode 78 and the second electrode 79 function to supply forward current to the semiconductor laser so as to generate laser beams, whereas the second switch SW2, the third electrode 80 and the fourth electrode 81 function to discharge the laser beams oscillated in the active layer 73, that is, to switch the output of the semiconductor laser.

As apparent from the above description, the present invention provides a semiconductor laser diode which emits laser beams in the Z-axis direction, differently from the conventional laser diodes which emit laser beams in the Y-axis direction. Accordingly, the semiconductor laser diode of the present invention makes it possible to process a plurality of optical signals arranged in two dimensions and thus to achieve the integration of semiconductor lasers.

Although the preferred embodiments of the invention have been disclosed for illustrative purpose, those skilled in the art will appreciate that various modifications, additions and substitutions are possible, without departing from the scope and spirit of the invention as disclosed in the accompanying claims.

What is claimed is:

1. A semiconductor laser comprising:
   a semiconductor substrate;
   a back reflection layer disposed over the semiconductor substrate;
   a first clad layer disposed over the back reflection layer;
   an active layer disposed over the first clad layer, the active layer having a width smaller than that of the first clad layer;
   a second clad layer formed over the active layer, the second clad layer having a flat upper surface and a width substantially identical to that of the first clad layer;
   a front reflection layer disposed over the second clad layer;
   a first impurity diffusion region of a first conductivity type extending from an upper surface of the second clad layer to a predetermined depth portion of the first clad layer, the first impurity diffusion region being in contact with a first side portion of the active region;
   a second impurity diffusion region of a second conductivity type extending from an upper surface of the second clad layer to a predetermined depth portion of the first clad layer, the second impurity diffusion region being in contact with a second portion of the active region;
   a first electrode adapted to oscillate laser beams and disposed over an upper surface of the first conductivity type impurity diffusion region;
   a second electrode adapted to oscillate laser beams and disposed over an upper surface of the second conductivity type impurity diffusion region;
   a third electrode adapted to discharge laser beams and disposed over the front reflection layer; and
   a fourth electrode adapted to discharge laser beams and disposed beneath a bottom surface of the semiconductor substrate.

2. A semiconductor laser in accordance with claim 1, further comprising:
   a first voltage source;
   a second voltage source;
   a first switch;
   a second switch;
   a first wire adapted to connect the first voltage source and the first switch in series between the first electrode and the second electrode, so as to supply a predetermined magnitude of forward current to the semiconductor laser for laser oscillation; and
   a second wire adapted to connect the second voltage source and the second switch in series between the third electrode and the fourth electrode, so as to supply a predetermined magnitude of forward current to the semiconductor laser for switching the laser beam discharge.

3. A semiconductor laser in accordance with claim 1, wherein the semiconductor substrate is made of a compound semiconductor.

4. A semiconductor laser in accordance with claim 3, wherein the compound semiconductor is one of GaAs and InP.

5. A semiconductor laser in accordance with claim 1, wherein the first and second clad layers are made of a compound semiconductor.

6. A semiconductor laser in accordance with claim 5, wherein the compound semiconductor is one of $Ga_xAl_{1-x}As$ and InP.

7. A semiconductor laser in accordance with claim 1, wherein the front and back reflection layers and the active layer have a multi-layered laminate structure.

8. A semiconductor laser in accordance with claim 7, wherein the front reflection layer has a multi-layered laminate structure having alternately arranged Si laminate layers and $Al_2O_3$ laminate layers.

9. A semiconductor laser in accordance with claim 7, wherein the back reflection layer has a multi-layered laminate structure having alternately arranged AlAs laminate layers and GaAs laminate layers.

10. A semiconductor laser in accordance with claim 7, wherein the active layer has a multi-layered laminate structure having a plurality of GaAs laminate layers or alternately arranged GaAs laminate layers and GaAlAs laminate layers.

11. A semiconductor laser in accordance with claim 1, wherein the first and second electrodes are made of one of a metal and a polysilicon doped with impurity ions having a predetermined conductivity.

12. A semiconductor laser in accordance with claim 1, wherein both the first and second electrodes are spaced apart from the front reflection layer to prevent the first and second electrodes from contacting the front reflection layer.

13. A semiconductor layer in accordance with claim 1, wherein the third and fourth electrodes are made of a transparent electrode material.

14. A semiconductor laser in accordance with claim 13, wherein the transparent electrode material is an indium tin oxide.

15. A semiconductor laser in accordance with claim 1, wherein the first and second conductivity type impurity diffusion regions have an impurity ion concentration higher than an impurity ion concentration of each of the first clad layer, the active layer and the second clad layer.

16. A method for manufacturing a semiconductor laser, comprising the steps of:

preparing a compound semiconductor substrate;

forming a back reflection layer having a multi-layered structure over the compound semiconductor substrate;

forming a first clad layer over the back reflection layer;

forming an active layer having a multi-layered structure over the first clad layer, the active layer having a width smaller than that of the first clad layer;

forming a second clad layer over substantially entire resultant exposed surface formed after the formation of the active layer, the second clad layer having a flat upper surface;

forming a first mask pattern over the second clad layer such that a portion of the upper surface of the second clad layer disposed near one side of the active layer is exposed through the first mask pattern;

implanting first impurity ions of a first conductivity type in the exposed upper surface portion of the second clad layer and diffusing the first impurity ions to form an impurity diffusion region of the first conductivity type extending from the upper surface of the second clad layer to a predetermined depth portion of the first clad layer, the first conductivity type impurity diffusion region being in contact with the one side of the active layer;

removing the first mask pattern and forming a second mask pattern over the second clad layer such that a portion of the upper surface of the second clad layer disposed near the other side of the active layer is exposed through the second mask pattern;

implanting second impurity ions of a second conductivity type in the exposed upper surface portion of the second clad layer disposed near the other side of the active layer and diffusing the second impurity ions to form an impurity diffusion region of the second conductivity type extending from the upper surface of the second clad layer to a predetermined depth portion of the first clad layer, the second conductivity type impurity diffusion region being in contact with the other side of the active layer;

forming a front reflection layer having a multi-layered structure over a portion of the upper surface of the second clad layer disposed over the active layer;

forming a first electrode and a second electrode over the first conductivity type impurity diffusion region and the second conductivity type impurity diffusion region, respectively, each of the first and second electrodes having a width smaller than that of each corresponding impurity diffusion region; and forming a third electrode and a fourth electrode over the front reflection layer and beneath the compound semiconductor substrate, respectively, the third and fourth electrodes having widths substantially the same as the widths of the front reflection layer and the compund semiconductor substrate, respectively.

17. A method for manufacturing a semiconductor laser in accordance with claim 16, wherein the first clad layer and the second clad layer are made of a same material.

18. A method for manufacturing a semiconductor laser in accordance with claim 17, wherein the material of the first and second clad layers is one of $Ga_xAl_{1-x}As$ and InP.

19. A method for manufacturing a semiconductor laser in accordance with claim 16, wherein the first and second mask patterns are made of photoresist.

20. A method for manufacturing a semiconductor laser in accordance with claim 16, wherein the compound semiconductor substrate is made of one of GaAs and InP.

21. A method for manufacturing a semiconductor laser in accordance with claim 16, wherein the first and second clad layers and the front and back reflection layers are formed by one of a chemical vapor deposition method and an epitaxial growth method.

22. A method for manufacturing a semiconductor laser in accordance with claim 16, wherein the active layer comprises a plurality of laminate layers made of a direct transition type semiconductor.

23. A method for manufacturing a semiconductor laser in accordance with claim 22, wherein the direct transition type semiconductor is one of GaAs and InGaAsP.

24. A method for manufacturing a semiconductor laser in accordance with claim 16, wherein the front reflection layer comprises a plurality of alternately arranged laminate layers made of different materials having different refractive indexes.

25. A method for manufacturing a semiconductor laser in accordance with claim 24, wherein the laminate layers having different refractive indexes are Si laminate layers and $Al_2O_3$ laminate layers.

26. A method for manufacturing a semiconductor laser in accordance with claim 16, wherein the back reflection layer comprises a plurality of alternately arranged laminate layers made of different materials having different refractive indexes.

27. A method for manufacturing a semiconductor laser in accordance with claim 26, wherein the laminate layers having different refractive indexes are AlAs laminate layers and GaAs laminate layers.

28. A method for manufacturing a semiconductor laser in accordance with claim 16, wherein the first and second electrodes are made of one of a metal and a polysilicon doped with impurity ions of a predetermined conductivity type.

29. A method for manufacturing a semiconductor laser in accordance with claim 16, wherein the third and fourth electrodes are made of a transparent electrode material.

30. A method for manufacturing a semiconductor laser in accordance with claim 29, wherein the transparent electrode material is indium tin oxide.

* * * * *